(12) United States Patent
Barth et al.

(10) Patent No.: US 7,275,562 B2
(45) Date of Patent: Oct. 2, 2007

(54) EXTENSIBLE SPIRAL FOR FLEX CIRCUIT

(75) Inventors: Phillip W. Barth, Portola Valle, CA (US); Kevin Killeen, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1042 days.

(21) Appl. No.: 09/981,840

(22) Filed: Oct. 17, 2001

(65) Prior Publication Data
US 2003/0070833 A1    Apr. 17, 2003

(51) Int. Cl.
*E03B 11/00* (2006.01)
*F17D 1/00* (2006.01)

(52) U.S. Cl. .................... 137/590; 210/198.2
(58) Field of Classification Search ............... 174/250, 174/254, 255; 361/749–751, 776; 210/198.2; 137/590
See application file for complete search history.

(56) References Cited

U.S. PATENT DOCUMENTS

| | | | |
|---|---|---|---|
| 3,950,846 A | | 4/1976 | Johnson |
| 3,968,336 A | | 7/1976 | Johnson |
| 3,979,568 A | | 9/1976 | Johnson |
| 4,066,860 A | | 1/1978 | Kawasaki |
| 4,350,412 A | | 9/1982 | Steenblik et al. |
| 4,587,719 A | | 5/1986 | Barth |
| 4,879,632 A | * | 11/1989 | Yamamoto et al. ......... 361/720 |
| 4,919,403 A | | 4/1990 | Bartholomew |
| 4,928,206 A | | 5/1990 | Porter et al. |
| 4,961,709 A | | 10/1990 | Noschese |
| 5,034,688 A | * | 7/1991 | Moulene et al. ............ 324/760 |
| 5,082,997 A | | 1/1992 | Vialy |
| RE34,084 E | | 9/1992 | Noschese |
| 5,186,238 A | * | 2/1993 | del Puerto et al. ......... 165/80.4 |
| 5,197,889 A | | 3/1993 | Rizzo et al. |

(Continued)

FOREIGN PATENT DOCUMENTS

EP    1085355 A2    4/2000

(Continued)

OTHER PUBLICATIONS

Fjelstad, Joseph C., "An Independent Journal Dedicated to the Advancement of Chip-Scale Electronics-Tutorial: An Overview of Flexible Printed Circuit Technology", Chipscale Review.Com, Jan.-Feb. 2001.

(Continued)

*Primary Examiner*—Dean A. Reichard
*Assistant Examiner*—Jeremy C. Norris

(57) ABSTRACT

A planar extensible structure in a flat planar flex circuit can be extended out of the plane of the circuit by a distance of more than the width of the structure to carry fluids, electrical signals or optical signals into and out of the circuit. The planar extensible structure may be an Archimedes spiral, a parabolic spiral, a polygonal spiral, a non-spiral extensible shape, or other extensible shape. The invention can be used to siphon fluid samples from each well in a multiple-well microtiter plate into a microfluidic manifold for utility in chemical and biochemical analysis. The invention can also be used to allow electrical interconnect between adjacent circuits or circuit boards, and can allow signals carried in optical fibers to be transferred between optical circuits in different planes.

23 Claims, 7 Drawing Sheets

U.S. PATENT DOCUMENTS

| | | | |
|---|---|---|---|
| 5,297,967 A * | 3/1994 | Baumberger et al. | 439/66 |
| 5,452,182 A | 9/1995 | Eichelberger et al. | |
| 5,500,071 A | 3/1996 | Kaltenbach et al. | |
| 5,525,845 A | 6/1996 | Beale et al. | |
| 5,555,972 A | 9/1996 | Schwab | |
| 5,571,410 A | 11/1996 | Swedberg et al. | |
| 5,641,400 A | 6/1997 | Kaltenbach et al. | |
| 5,645,702 A | 7/1997 | Witt et al. | |
| 5,651,529 A * | 7/1997 | Lieb | 251/127 |
| 5,658,413 A | 8/1997 | Kaltenbach et al. | |
| 5,673,785 A | 10/1997 | Schlaak et al. | |
| 5,802,699 A * | 9/1998 | Fjelstad et al. | 29/593 |
| 5,804,022 A | 9/1998 | Kaltenbach et al. | |
| 5,812,378 A | 9/1998 | Fjelstad et al. | |
| 5,835,646 A | 11/1998 | Yoshimura et al. | |
| 5,857,661 A * | 1/1999 | Amada et al. | 251/57 |
| 5,859,472 A | 1/1999 | DiStefano et al. | |
| 5,882,571 A | 3/1999 | Kaltenbach et al. | |
| 5,900,674 A | 5/1999 | Wojnarowski et al. | |
| 5,902,435 A | 5/1999 | Meis et al. | |
| 5,919,155 A * | 7/1999 | Lattin et al. | 604/20 |
| 5,924,603 A * | 7/1999 | Santagiuliana | 222/321.1 |
| 5,938,452 A | 8/1999 | Wojnarowski et al. | |
| RE36,350 E | 10/1999 | Swedberg et al. | |
| 5,973,394 A | 10/1999 | Slocum et al. | |
| 5,981,064 A | 11/1999 | Burack et al. | |
| 6,005,991 A | 12/1999 | Knasel | |
| 6,029,344 A | 2/2000 | Khandros et al. | |
| 6,033,433 A | 3/2000 | Ehr et al. | |
| 6,033,628 A | 3/2000 | Kaltenbach et al. | |
| 6,046,410 A | 4/2000 | Wojnarowski et al. | |
| 6,069,991 A | 5/2000 | Hibbs-Brenner et al. | |
| 6,088,498 A | 7/2000 | Hibbs-Brenner et al. | |
| 6,091,874 A | 7/2000 | Higashi et al. | |
| 6,092,280 A | 7/2000 | Wojnarowski et al. | |
| 6,093,362 A | 7/2000 | Kaltenbach et al. | |
| 6,097,871 A | 8/2000 | De Dobbelaere et al. | |
| 6,194,900 B1 | 2/2001 | Freeman et al. | |

FOREIGN PATENT DOCUMENTS

| | | | |
|---|---|---|---|
| GB | 2294 365 A | 10/1994 | |

OTHER PUBLICATIONS

Venkat, SRI, "Laser Proceesing of Flex", PC Fab.Com, Feb. 2001.

Lee, Xah, "Special Plane Curves: Archimedean Spiral", Xahlee.Org, Copyright 1995-97.

Fjelstad, Joseph, "Flexible Circuitry-Technology Background and Important Fundamental Issues", www.Tessera.com/Library.CFM, 2001.

Hermann Wollnik, "Optics of Charged Particles", Academic Press, 1987, chpts. 3, pp. 48-88 and 9, pp. 253-290.

* cited by examiner

US 7,275,562 B2

EXTENSIBLE SPIRAL FOR FLEX CIRCUIT

BACKGROUND OF THE INVENTION

1. Field of the Invention

The present invention relates to fluidic, electrical, electronic, and optical flex circuits and connections thereto.

2. Background of the Invention

Flex circuits, also known as flexible circuits, flexible printed circuit boards, and flexible printed wiring, are circuits made in or on flexible substrates, which substrates are substantially planar in shape. The flexible substrates may be bent and folded in order to accommodate three-dimensional shape requirements.

Flex circuits were first described by Albert Hanson of Berlin, Germany in British Patent 4,681 issued in 1903. The patent is noted in "Flexible Circuitry—Technology Background and Important Fundamental Issues"by Joseph Fjelstad, available on the internet at http://www.tessera.com/library.cfm, which article also provides a good overview of electrical flex circuit technologies. Further overview material on flex circuits is provided by the same author, Joseph C. Fjelstad, Pacific Consultants LLC, Mountain View, Calif., in "Tutorial: An Overview of Flexible Printed Circuit Technology,"Chip Scale Review Online, January-February 2001, available as a link on the internet at
http://www.chipscalereview.com/issues/0101/homeissue-.html and given in full at
http://www.chipscalereview.com/issues/0101/tutorial_01.html.

Hanson's 1903 patent described the production of flexible flat conductors on a sheet of insulating paraffin-coated paper. Today, flex circuits are typically made using polyimide such as DuPont® Kapton™ as the flexible insulating material, although many other materials including paper, polyamide, polyester terephthalate (PET), random-fiber aramid (Nomex), and polyvinyl chloride (PVC) may be used. Embedded within or upon the flex circuit can be electrical leads and electrical devices such as microchips. Recessed within the surface of the flex circuit can be fluid wells and trenches, while embedded within the flex circuit can be fluid capillary channels. Embedded within or upon the flex circuit can also be optical devices including fiber optic elements, optical gratings, optical sources, and optical receivers. If the flex circuit has only electrical leads it is often called an electrical flex circuit, while if it has fluid wells, trenches, or capillary channels it is often called a fluid flex circuit or a microfluidic circuit. If it has optical elements it can be called an optical flex circuit or a flexible optical circuit; see, for example, U.S. Pat. Nos. 5,902,435; 6,005,991; 6,069,991; 6,088,498; and 6,222,976. Fluid flex circuits and microfluidic circuits can include electrical elements; see, for example, U.S. Pat. Nos. 5,645,702; 5,658,413; 5,804;022; 5,882,571; and 6,093,362. The advantageous three-dimensional nature of flex circuitry is well known. See, for example, U.S. Pat. No. 4,928,206, "Foldable Printed Circuit Board."

Connecting an external electrical, fluid, or optical path to a flex circuit typically requires entering the plane of the flex circuit from some out-of-plane direction. This simple objective has historically been very challenging and has required complex structures. See, for example, U.S. Pat. Nos. 6,033, 628; and 6,194,900 in which the connectors to a flexible fluid circuit substrate require separate assembly.

The problem of fluid interconnections has been addressed by Hans-Peter Zimmerman (see, e.g., U.S. patent application Ser. No. 09/570,948, application date May 15, 2000 entitled "Coupling to Microstructures for a Laboratory Microchip"). Zimmerman describes flexible structures that can bend out of the plane of a flexible substrate, but the bending of such structures is only simple cantilever bending. One disadvantage associated with simple cantilever bending is that it is impossible, for example, to space sample introduction siphons at the 4.5 mm well spacing centers of a standard 384-well microtiter plate, because the 12 mm reach required is greater than the 4.5 mm spacing so that there is simply no room to place all of the required cantilever siphons. In order to get dense interconnections an improved structure is required.

Flex circuits have been fabricated incorporating bending structures that are more complicated than simple cantilevers. For example, U.S. Pat. No. 4,587,719 by the present inventor describes a method of folding a polyimide flex circuit that results in a structure that remains in the original plane of the flex circuit. However, the U.S. Pat. No. 4,587,719 does not teach a method or apparatus for reaching out of the plane of the circuit, nor does it teach any method or apparatus for out-of-plane interconnection.

Regarding electrical interconnections, several schemes are presented in U.S. Pat. Nos. 4,961,709; 5,197,889; 5,452, 182; 5,812,378; 5,859,472; 5,900,674; 5,938,452; 5,973, 394; 6,029,344; 6,033,433; 6,046,410; 6,092,280; and RE34084 for achieving dense interconnections between circuits, but none of these schemes exhibit the simplicity of fabrication that can be obtained if the interconnection structure can be fabricated within the structure of the flex circuit.

Regarding optical interconnections, the art of optical flex circuits is fairly young in development. See, for example, U.S. Pat. Nos. 5,835,646; 5,902,435; 5,981,064; 6,005,991; 6,069,991; 6,088,498; 6,091,874; and 6,097,871. However, the art of optical interconnections does not provide solutions for simple and dense optical interconnections between face-to-face adjacent planar optical flex circuits. It is often most important in an optical interconnect to avoid losing the light from a fiber due to bending or kinking of the fiber. It is of secondary importance to achieve a long reach from the substrate plane.

Planar springs are taught to some degree in U.S. Pat. Nos. 3,950,846; 3,968,336; 3,979,568; 4,066,860; 4,548,086; 4,919,403; 5,082,997; 5,525,845; 5,555,972; and 5,673,785. In particular a planar spiral spring extending out of the plane of the substrate is taught in U.S. Pat. Nos. 4,066,860 and 5,673,785. However, the patents do not teach or allude to isolating an electrical lead or other conveying element on or in the spring. Additionally, the spring cannot be extended to a distance greater than the width of the spring.

Thus, there still exists a need for a flexible structure that can reach out of the plane of a flexible substrate, for purposes of interconnection and sample transfer, which can be spaced on the flexible substrate at a center-to-center distance smaller than the distance by which it reaches out of the plane, and which is simple to fabricate.

SUMMARY OF THE INVENTION

Flex circuit is described herein, which is capable of reaching out of a flexible substrate. The flex circuit of the invention may be spaced on a flexible substrate at a center-to-center distance smaller than the distance by which it reaches out of the plane. In a flexible planar substrate, a planar structure is formed that can be elastically extended out of the plane of the substrate, for example by being pushed with a pin. The structure may be spiral-shaped or of another extensible configuration. The structure can comprise, for example, a spiral fluid capillary in the form of an Archimedean spiral with a central shield containing a hole that can be engaged by a pin, so that the capillary can be extended out of the plane of the substrate by the pin. Alternatively, the structure can comprise, for example, an electrical lead so that the electrical lead is extended out of the plane of the substrate. Additionally, the structure can comprise an optical waveguide constructed so that its radii of curvature are large enough that substantially no light escapes from the waveguide.

The above advantages and additional advantages will become apparent from the following detailed description when taken in conjunction with the accompanying drawings.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE
EXEMPLARY EMBODIMENTS OF THE
PRESENT INVENTION

Figure 1:
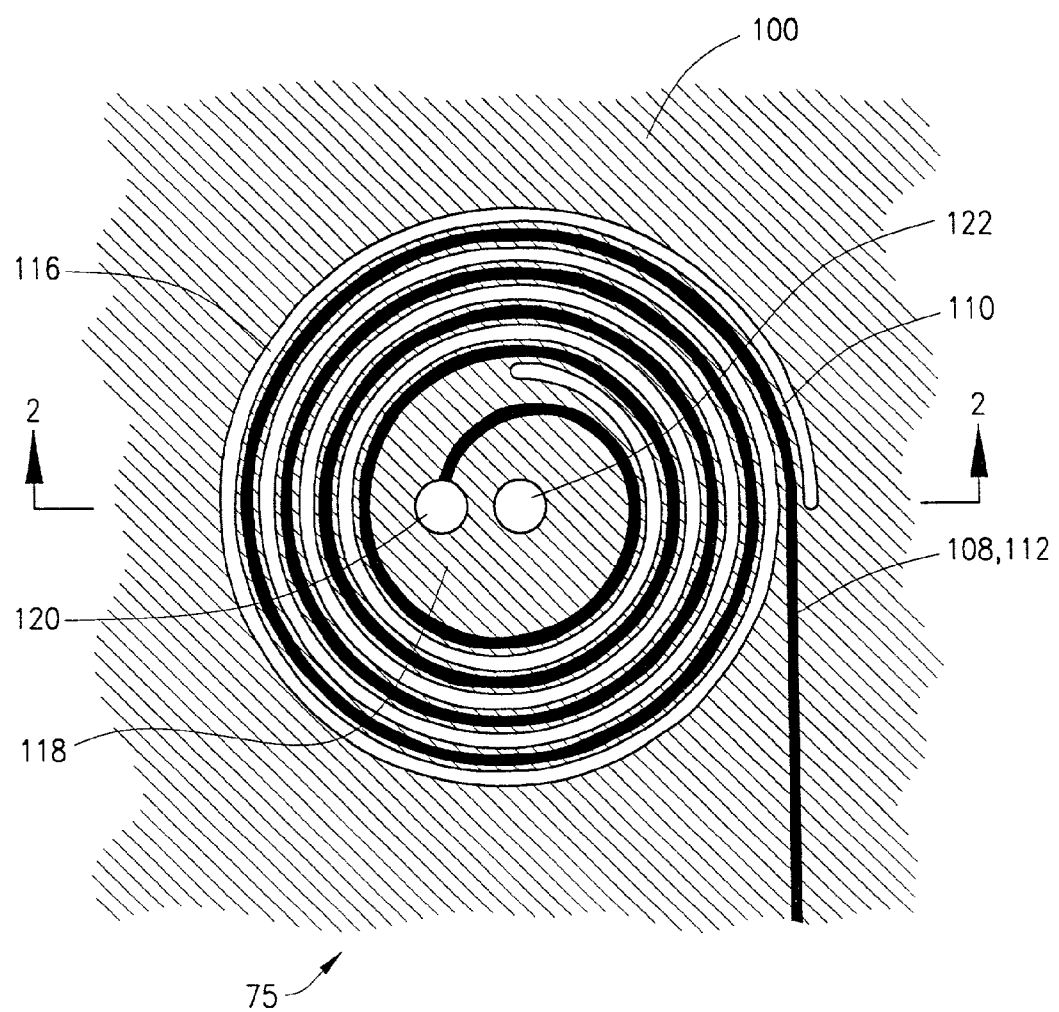
FIG. 1 is a plan view of an exemplary circuit substrate defining a structure and having a pathway.
Figure 2:
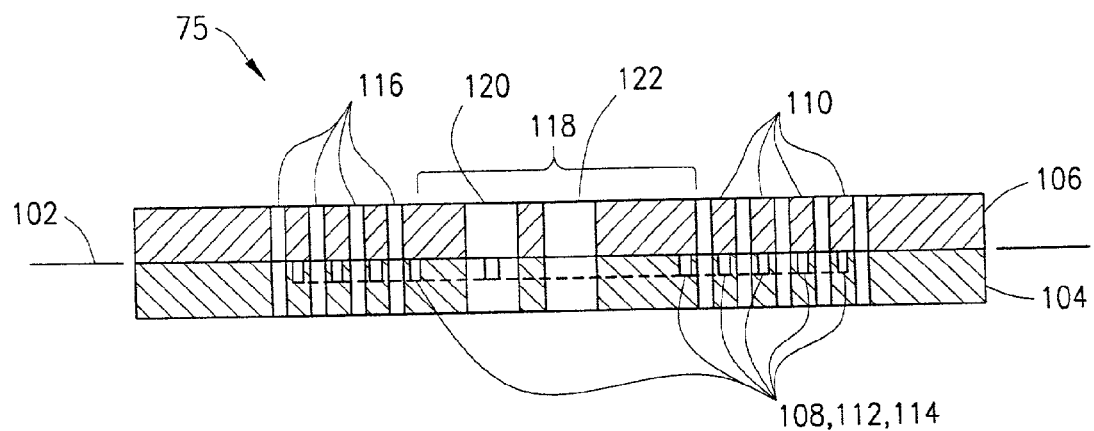
FIG. 2 is a cross-sectional view of FIG. 1 taken along line 2—2 of FIG. 1.

Referring now to FIGS. 1 and 2, an exemplary flex circuit 75 is shown. Flex circuit 75 has a flex circuit substrate 100 that defines a plane 102 (visible in FIG. 2). Substrate 100 is formed from a base sheet 104 (FIG. 2) and a cover sheet 106 (FIG. 2). Base sheet 104 is a flat sheet of polyimide, e.g., a DuPont Kapton® H sheet. It is understood that various other materials can be used, such as paper, polyamide, polyester terephthalate (PET), random-fiber aramid (Nomex), and polyvinyl chloride (PVC). Metal foils and sheets can also be used either separately from electrical insulators where electrical insulation is not required or in conjunction with electrical insulators to provide improved structural characteristics. Base sheet 104 is about 50 μm (micrometers) thick, but can have a thickness in a range of about 25 μm (micrometers) to 1 mm. Cover sheet 106 is laminated to base sheet 104 to form substrate 100. Cover sheet 106 is a sheet of, e.g., DuPont Kapton® HKJ. Cover sheet 106 is also about 50 μm thick, but may also have a range of thicknesses similar to the base sheet 104. Cover sheet 106 has thermoplastic adhesive on both outer surfaces to facilitate bonding with base sheet 104. Pathway 108 forms a part of circuit substrate 100, and is substantially co-planar therewith. Pathway 108 may be a capillary for transferring a fluid or gas, an electrical lead for transmitting a signal, an optical waveguide for transmitting an optical signal or other device for transmitting a signal. Pathway 108 is affixed to a structure 110.

Assuming here that Pathway 108 is a fluid capillary 112, to form the fluid capillary 112, a trench 114 (FIG. 2) is formed on an upper surface of base sheet 104. Fluid capillary 112 is formed when trench 114 is enclosed by securing cover sheet 106 to base sheet 104. Groove 116 is cut completely through substrate 100. Groove 116 frees structure 110 from the surrounding substrate 100. An exemplary method for cutting groove 116 is laser ablation, although other known methods may be used, such as water jets, mechanical cutting tools or photo lithography followed by etching. Preferably, groove 116 is formed in a single operation after cover sheet 106 is secured to base sheet 104, but groove 116 can also be formed as two separate grooves in sheets 106 and 104 which are then secured to one another forming a single groove 116. A central boss 118 is located in an area bounded by structure 110. An entrance hole 120 is defined in central boss 118 and communicates with an end of fluid capillary 112. A central hole 122 is also defined in central boss 118.

Figure 3:
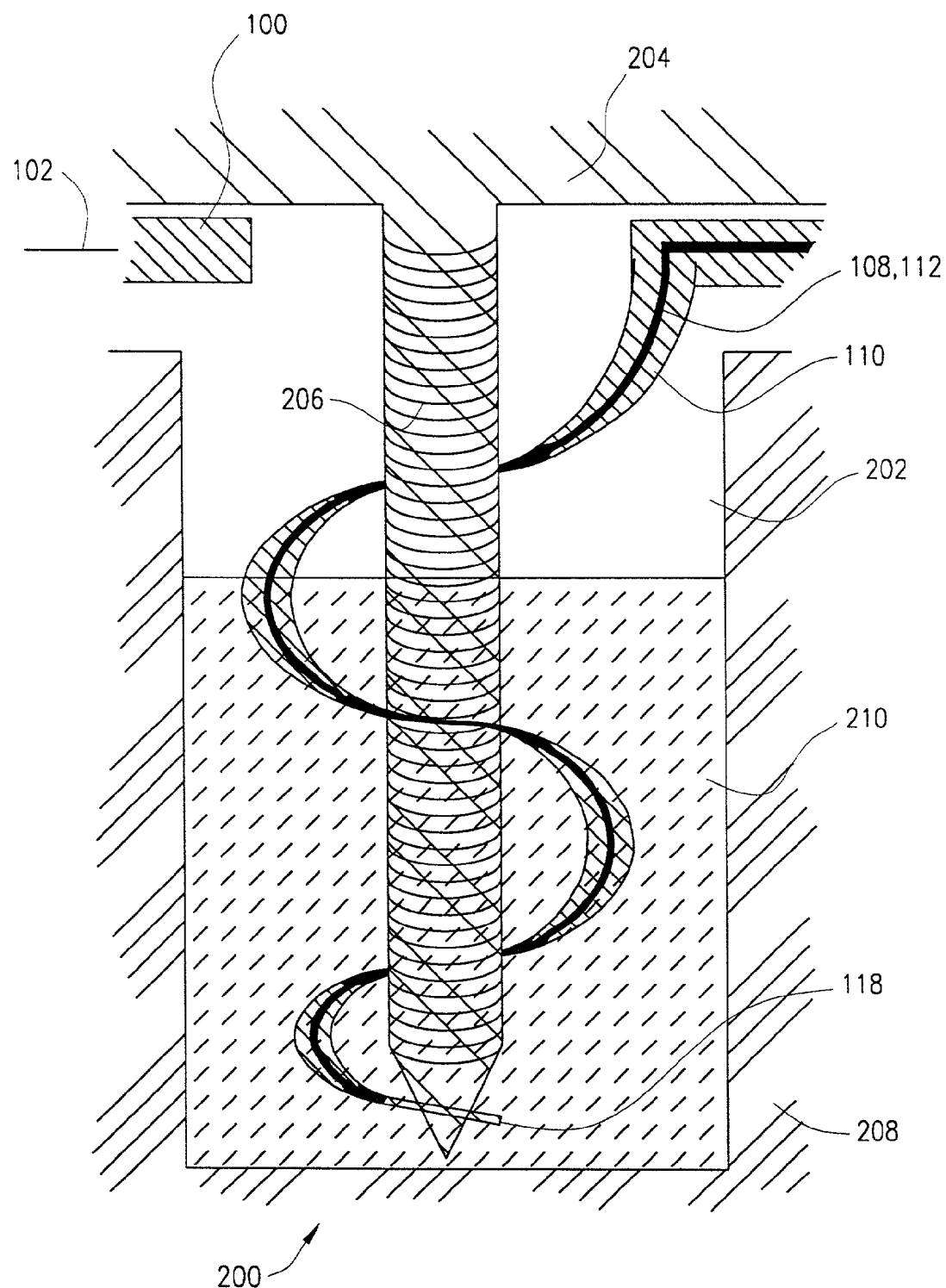
FIG. 3 is a partial sectional elevation view of an exemplary assembly wherein the structure of the circuit substrate of FIG. 1 is being pushed out of a plane of the substrate by a pin.

Referring now to FIG. 3, a partial sectional view of an assembly 200 is shown. Assembly 200 includes circuit substrate 100, which in the embodiment shown is microfluidic. In this example, pathway 108 is a fluid capillary 112. Assembly 200 also includes a target area or sample well 202, and pin bearing substrate 204, which carries pin 206. Sample well 202 may be one well in a multiple-well microtiter plate. Sample well 202 is defined by walls 208. Sample well 202 contains sample solution 210.

The fluid capillary 112, which has been cut from substrate 100, as shown in FIG. 1, is shown in FIG. 3 being pushed out of plane 102 by pin 206 such that structure 110 is no longer co-planar with substrate 100. Structure 110 is constructed such that structure 110 can be extended out of plane 102 by a distance greater than a maximum lateral dimension of the structure. Pin 206 is used to push structure 110 into sample well 202 to make contact with sample solution 210, as shown in FIG. 3. Pin 206 engages central hole 122 (FIG. 1) in central boss 118. Pin bearing substrate 204 carries multiple pins 206, e.g., in a bed-of-nails configuration, so that many structures, such as structure 110, can be simultaneously extended into many wells such as sample well 202. Sample solution 210 enters entrance hole 120 (FIG. 1) in central boss 118 and travels up the pathway 108, which in this embodiment is fluid capillary 112, into substrate 100. Transport of the sample solution 210 can be aided by one or more of gas pressure applied in sample well 202, capillary action in fluid capillary 112, vacuum applied downstream through fluid capillary 112, electrophoretic flow due to a voltage applied between pin 206 and an electrode disposed downstream, either within fluid capillary 112 or external to fluid capillary 112, and electroosmotic flow due to a voltage applied between pin 206 and an electrode disposed downstream, either within fluid capillary 112 or external to fluid capillary 112.

Fabrication of an exemplary embodiment of the invention for fluid transfer purposes is as follows. Trench 114 is formed in substrate 100 in a desired configuration. The trench 114 will later become fluid capillary 112. The trench 114 may be formed by excimer laser ablation using a mask, by vector-scanned laser machining using a focused beam, or by mechanically scanning the substrate with respect to a focused laser beam (see, e.g., Sri Venkat, "Laser Processing of Flex,"PC Fab [Printed Circuit Fabrication] magazine, CMPO Media LLC, February 2001, available on the web at http://www.pcfab.com/db_area/archive/2001/0102/venkat.html and is incorporated herein by reference.)

After laser machining of the trench 114, which can be one of many such trenches connected to other trenches on the same base sheet 104, the base sheet 104 is laminated to cover sheet 106. The cover sheet 106 has a thermoplastic adhesive on both outer surfaces of the cover sheet 106 and therefore bonds to the base sheet 104 to seal the trench 114 to form fluid capillary 214. Next, groove 116 is made completely through the laminated pair of sheets, i.e., base sheet 104 and cover sheet 106, which form substrate 100. Groove 116 is formed by laser milling. Entrance hole 120 is formed by laser milling. Entrance hole 120 is formed through both sheets to expose and open one end of fluid capillary 112. Alternatively, entrance hole 120 could open an end of fluid capillary 112 by laser machining through only one sheet, in a process known a skiving. Central hole 122 is then formed through base sheet 104 and cover sheet 106 to serve as an engagement location for push pin 206. Central hole 122 is formed by laser milling. Later, push pin 206 is used to extend the structure 110 carrying fluid capillary 112 out of the plane 102 of substrate 100.

Figure 4:
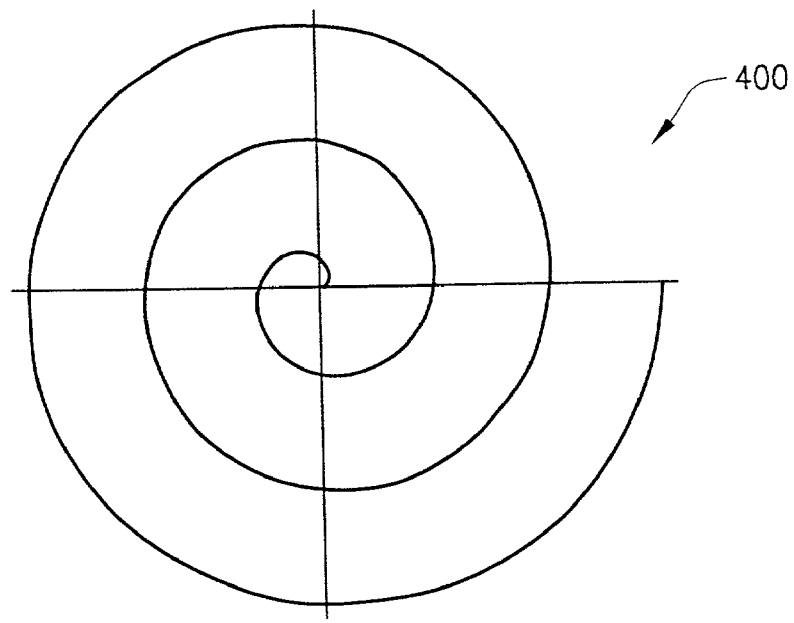
FIG. 4 is a plan view of a spiral of Archimedes, which is an exemplary pattern for the structure of FIG. 1.

Referring now to FIG. 4, in an exemplary embodiment, a Spiral of Archimedes, also known as an Archimedes Spiral, is used as a pattern for structure 110 for an exemplary embodiment of the present invention. The Archimedes Spiral occupies a minimum of area consonant with a maximum amount of extension and minimizes the concentration of bending stresses along the length of the spiral. FIG. 4 illustrates a sample Spiral of Archimedes 400. Spiral of Archimedes 400 can be expressed by the polar equation r=A θ, where r is the radial distance from a central point in the plane of the substrate 102, θ is the polar angle from a reference direction from the central point in the plane 102 of substrate 100, and A is a constant.

The path length S along a Spiral of Archimedes, e.g., spiral of Archimedes 400, of outer radius R is found by integrating a length element dS=r dθ=r (dr/A) from an initial radius value $R_1$ to the outer radius R, giving $$S = \frac{1}{A}\int_{R_1}^{R} r\,dr = \frac{R^2 - R_1^2}{2A} \qquad \text{Equation 1}$$

Assuming that the Spiral of Archimedes 400 can be deflected out of the initial plane of the flex circuit by an amount half of its path length, then the maximum deflection is $$Z_{max} = \frac{(R^2 - R_1^2)}{4A} \qquad \text{Equation 2}$$

One embodiment of the invention uses a polyimide for substrate 100, such as DuPont Kapton®. As an example, if we assume that the groove 116 cut through the substrate 100 has a width of 20 μm (micrometers), and that the center-to-center distance of one turn (2π radians) of the spiral 400 is 120 μm=A 2π, this gives a value for A of 120 μm /(2π)=28 μm per radian. If we choose an initial radius $R_1$=710 μm and an outer radius R=2,240 μm, this provides 12.75 turns of the spiral 400 and keeps the spiral 400 within the 4.5 mm center-to-center spacing of a standard 384-well microtiter plate. Then the total path length of the spiral 400 is evaluated from Equation 1 as 118 mm, and the maximum deflection is evaluated from Equation 2 as 59 mm, more than ten times the 4.5 mm lateral dimension of the spiral 400 in the plane 102 of the flexible substrate 100 and far greater than needed to reach to the bottom of a sample well 202 in a microtiter plate. A typical sample well 202 is 12 mm deep.

When used as part of the present invention, a Spiral of Archimedes 400 can result in both a tendency to angularly twist in the θ direction when the spiral 400 is extended out of the plane 102 of the substrate 100, and a tendency to tilt central boss 118 as depicted in FIG. 3. Still, a Spiral of Archmides, such as Spiral of Archmides 400 is preferred.

More generally, an Archimedean spiral can be expressed by the polar equation r=A $\theta^{(1/n)}$, where r is the radial distance, θ is the polar angle, A is a constant, and n is a constant which determines the tightness of the spiral.

Figure 5:
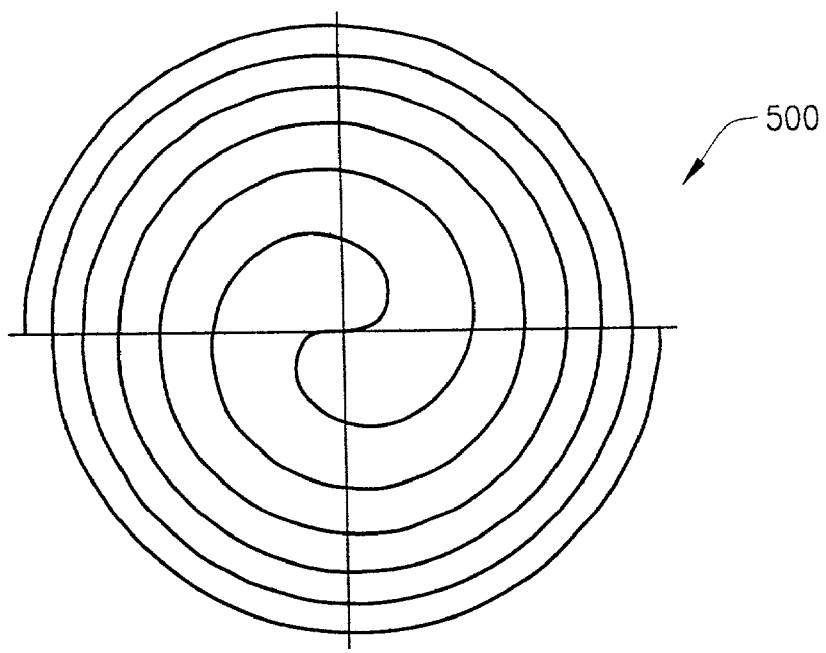
FIG. 5 is a plan view of a Fermat's Spiral, a.k.a. a Parabolic Spiral, which is another exemplary pattern for the structure of FIG. 1.

Referring now to FIG. 5, one form of the Archimedean spiral is Fermat's Spiral, which is also known as the Parabolic Spiral, designated generally 500. Parabolic spiral 500 has the equation r=A $\theta^{(1/2)}$. Parabolic spiral 500, in which two arms spiral outward from a central point, can be used for structure 110 in the present invention to avoid the tilting tendency exhibited by central boss 118 when the Spiral of Archimedes 400 is used. Advantageously, a parabolic spiral can, for example, permit an electrical lead to be carried on one spiral arm while a fluidic lead is carried on the second spiral arm. However, Parabolic Spiral 500 sacrifices some extension capability as compared to the Spiral of Archimedes 400. An example of Parabolic Spiral 500 is shown in FIG. 5.

Other spiral shapes containing multiple arms may also be used for structure 110. For example, U.S. Pat. No. 6,033,433, "Stent Configurations Including Spirals," which is incorporated herein by reference, presents some spiral shapes that could be adapted to be utilized by the present invention. However, the multiple arms of those spirals lead to a loss of area efficiently compared to the simple Spiral of Archimedes 400. A multiple arm embodiment may be advantageously used to add or remove multiple fluids simultaneously.

Figure 6A:
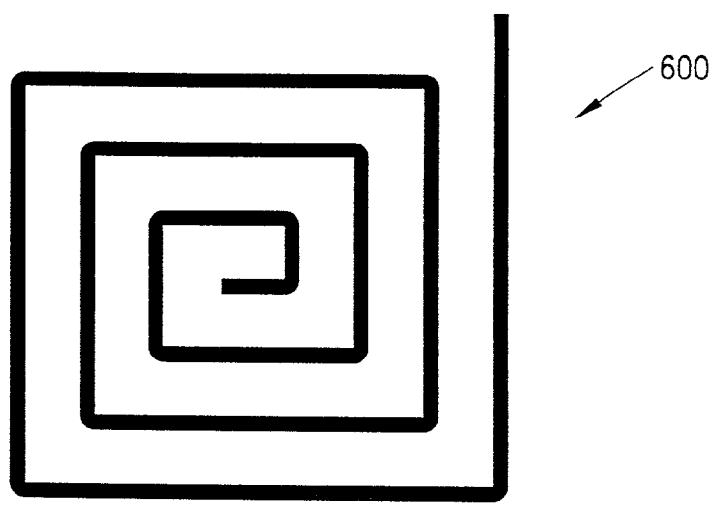
FIG. 6a is a plan view of a square spiral, which is an exemplary pattern for the structure of FIG. 1.
Figure 6B:
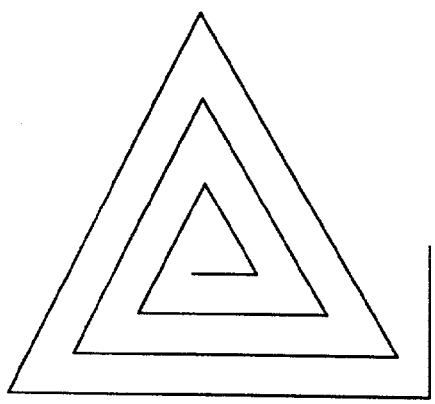
FIG. 6b is a plan view of a triangular spiral, which is an exemplary pattern for the structure of FIG. 1.
Figure 6C:
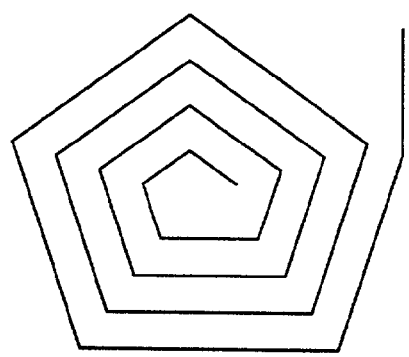
FIG. 6c is a plan view of a pentagonal spiral, which is an exemplary pattern for the structure of FIG. 1.
Figure 6D:
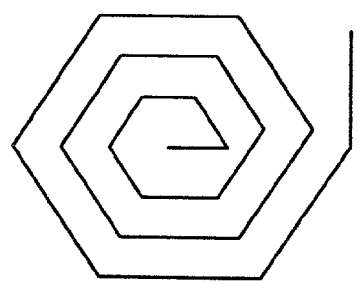
FIG. 6d is a plan view of a hexagonal spiral, which is an exemplary pattern for the structure of FIG. 1.

Other more angular implementations of a spiral shape, i.e., a polygonal spiral, can also be used for structure 110, including but not limited to a square spiral 600 (FIG. 6a) having four corners per turn of 360 angular degrees, a triangular spiral (FIG. 6b), a pentagonal spiral (FIG. 6c), a hexagonal spiral (FIG. 6d), or a spiral having different numbers of corners in each turn of 360 degrees. Such shapes have a disadvantage that stress concentrates at the angular corners.

Figure 7:
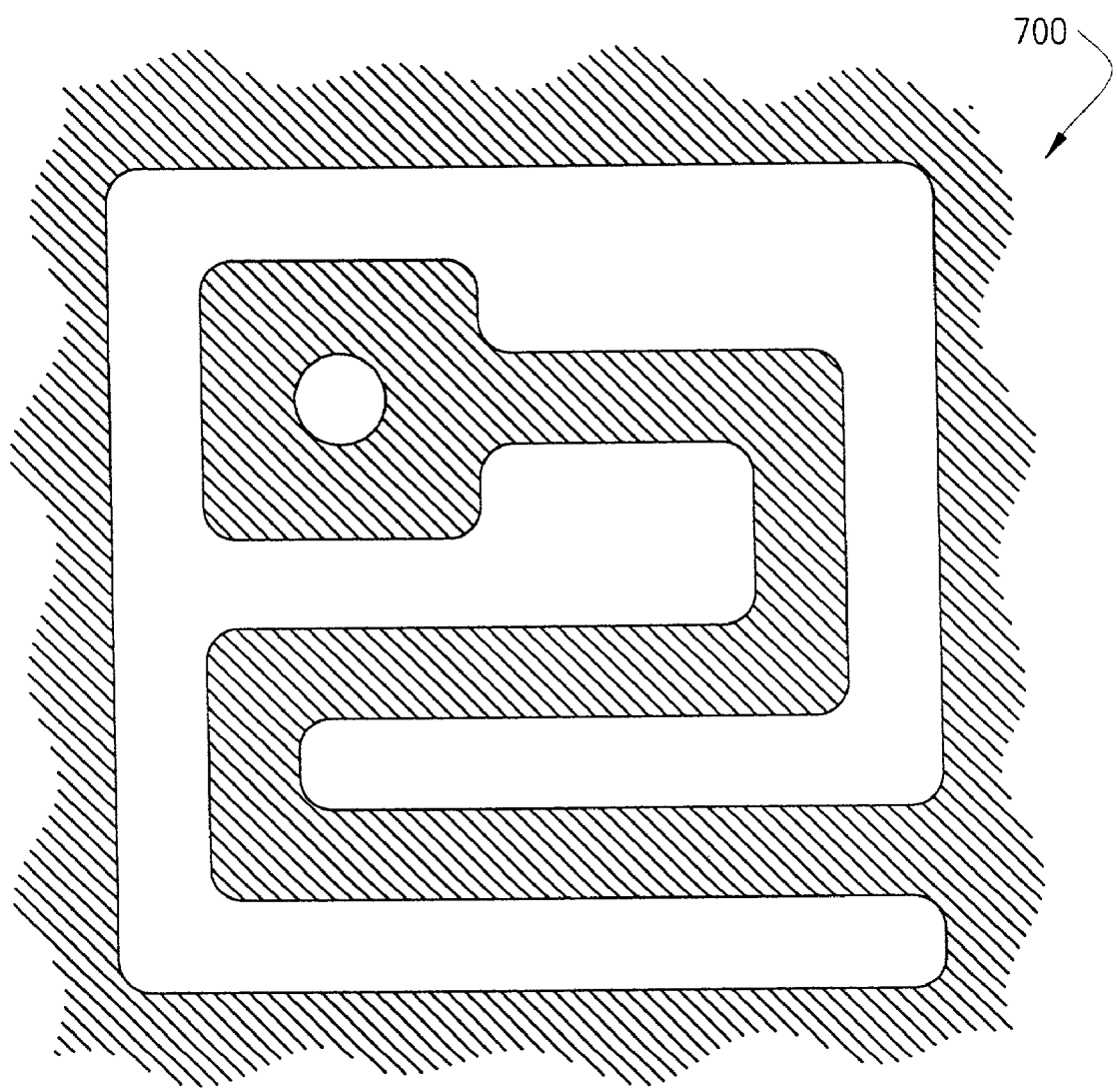
FIG. 7 is a plan view of a meandering shape, which is an exemplary pattern for the structure of FIG. 1.

Other spring shapes not exhibiting a spiral structure may also be used for structure 110 to embody the present invention. For example, FIG. 7 illustrates one such shape 700, which has a disadvantage that stress is concentrated at the corners of the meandering shape 700 and, additionally, that the shape 700 will tend to pull a pushing pin 206 off of a straight-line path as the structure is extended out of the plane 102 of the flex circuit 100.

Figure 8:
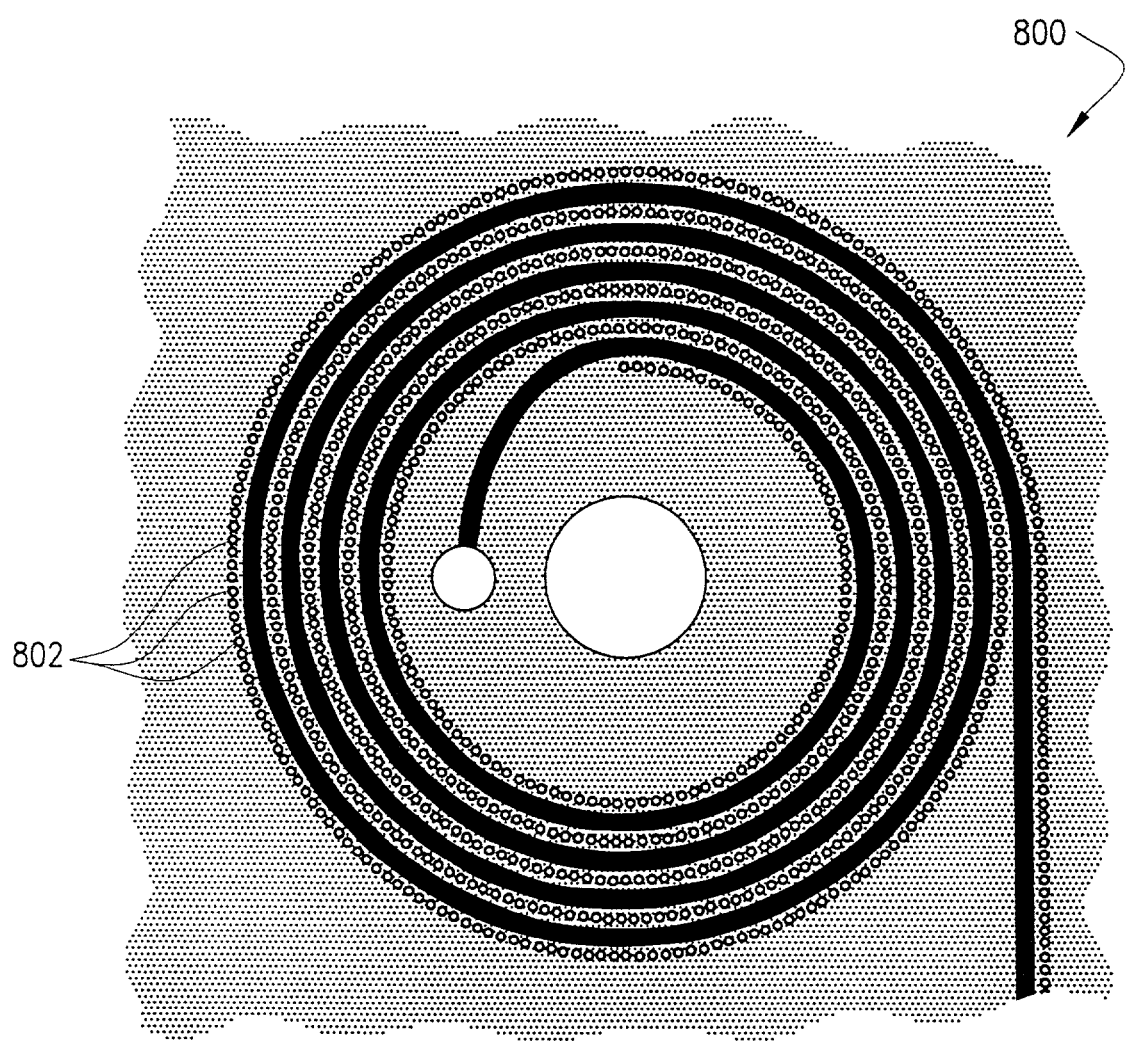
FIG. 8 is a plan view of a circuit substrate defining a perforated structure.

As another alternative embodiment of the invention, perforated structure 800 may be any of the above discussed shapes defined by perforations 802 rather than a freed shape. FIG. 8 shows a structure 800, which for example purposes, is in the shape of an Archimedes spiral. While it has been found that a freed spiral will support its own weight without appreciable sagging in a polyimide substrate that is 100 micrometers thick, other materials or thinner substrates may result in undesirable sagging of a freed spiral. The perforated structure 800 presents an alternative that avoids sagging, and can permit the structure 800 to be torn along the perforations 802 as the structure 800 is pushed by a pin 206 out of the plane 102 of the flex circuit 100.

Figure 9:
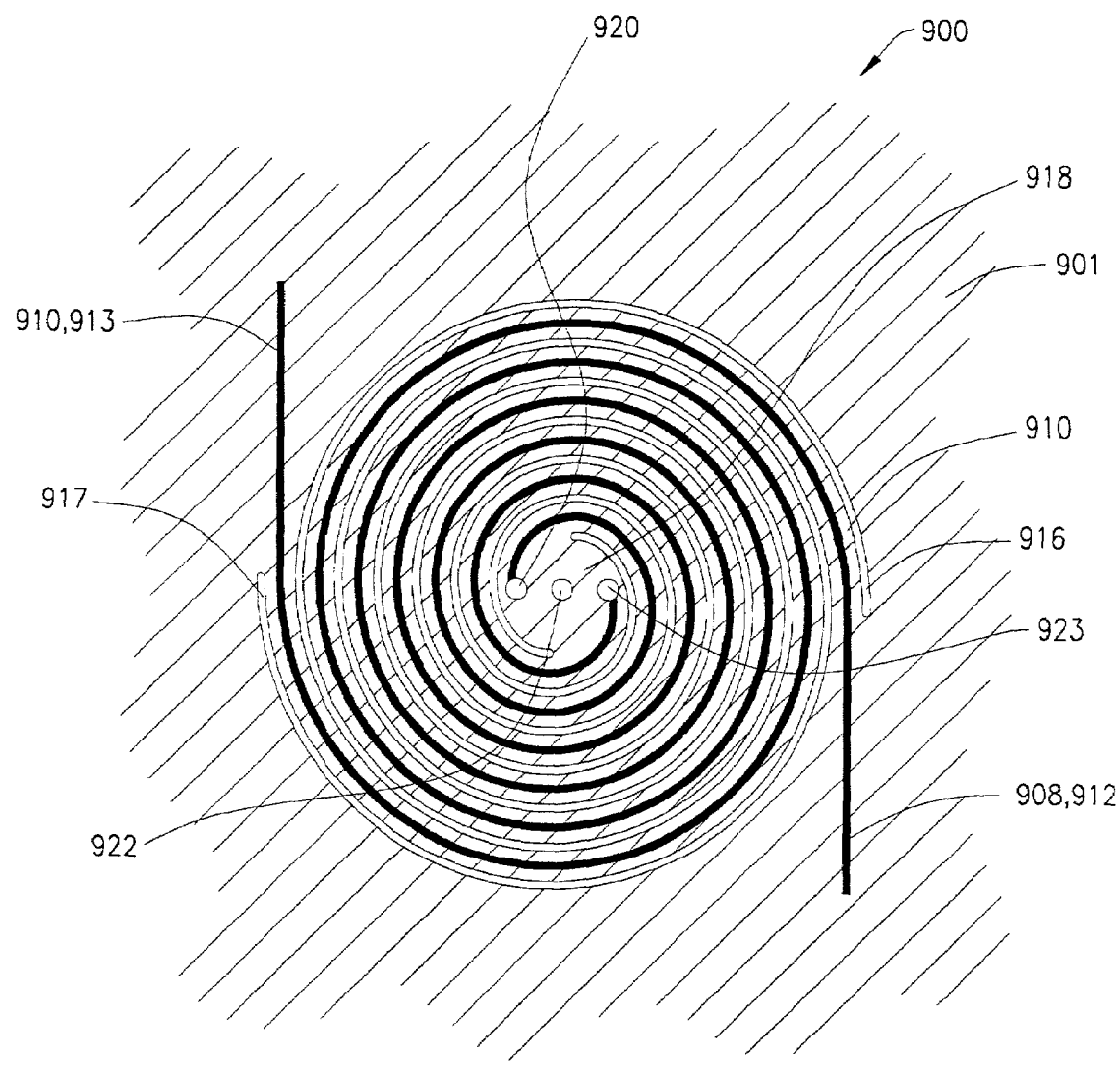
FIG. 9 is a plan view of a flex circuit of an embodiment.

Referring now to FIG. 9, an exemplary flex circuit 900 is shown. Flex circuit 900 has a flex circuit substrate 901 that defines a plane. Substrate 901 is formed from a base sheet and a cover sheet 106 . The base sheet is a flat sheet of polyimide, e.g., a DuPont Kapton® H sheet. It is understood that various other materials can be used, such as paper, polyamide, polyester terephthalate (PET), random-fiber aramid (Nomex), and polyvinyl chloride (PVC). Metal foils and sheets can also be used either separately from electrical insulators where electrical insulation is not required or in conjunction with electrical insulators to provide improved structural characteristics. The base sheet is 50 μm (micrometers) thick, but can have a thickness in a range of about 25 μm (micrometers) to 1 mm or more. A cover sheet is laminated to the base sheet to form substrate 901. The cover sheet 106 is a sheet of DuPont Kapton® HKJ or other suitable material. The cover sheet is also about 50 μm thick. The cover sheet has thermoplastic adhesive on both outer surfaces to facilitate bonding with the base sheet. Pathway 908 forms a part of circuit substrate 901, and is co-planar therewith. Pathway 908 may be a capillary for transferring a fluid substantially or gas, an electrical lead for transmitting a signal, an optical waveguide for transmitting an optical signal or other device for transmitting a signal. Pathway 908 is affixed to a structure 910.

In an exemplary embodiment, pathways 908 and 909 are fluid capillaries 912 and 913. To form fluid capillaries 912 and 913, trenches are formed on an upper surface of the base sheet. Fluid capillaries 912 and 913 are formed when the trenches are enclosed by securing the cover sheet to the base sheet. Grooves 916 and 917 are cut completely through substrate 901. Grooves 916 and 917 free structure 910 from the surrounding substrate 901. A method for cutting grooves 916 and 917 is laser ablation, although other known methods may be used, such as water jets, mechanical cutting tools or photolithography followed by etching. A central boss 918 is located in an area bounded by structure 910. An entrance hole 920 is defined in central boss 918 and communicates with an end of fluid capillary 912. A central hole 922 is also defined in central boss 118. A second entrance hole 923 is defined in central boss 918 and communicates with an end of fluid capillary 913. A method for forming holes 920, 922, and 923 is laser ablation, although other known methods may be used, such as water jets, mechanical cutting tools or photolithography followed by etching.

Flex circuit 900 may be used in a similar manner to flex circuit 100. However, flex circuit 900 allows for multiple pathways 908 and 909. It should be noted, however, that a simple Archimedes spiral such as used in structure 110 in FIG. 1 can also carry multiple parallel pathways without departing from the scope and spirit of the present invention.

While specific embodiments of the invention are shown herein, it should be apparent to those skilled in the art that it is not so limited, but is susceptible to various changes without depicting from the scope of the invention.

All of the above described structures have been described primarily in terms of a fluidic circuit, as noted above, pathway 108, for example, may also be an electrical lead for transmitting a signal, an optical waveguide for transmitting a signal or other device for transmitting a signal. Regardless, it is contemplated that in use, the flex circuit is manipulated out of its planar configuration, such that pathway 108 makes contact with a suitable medium for signal transfer, e.g., electrical lead, optical waveguide, etc.

We claim:

1. A flexible circuit comprising:
   a flexible planar substrate having a topside,
   a flexible and extensible structure formed within and originating as part of said flexible planar substrate, said stucture being co-planar with said substrate, said structure having a structure topside;
   an insulated capillary formed on said structure for transferring a fluid; and
   wherein said structure is extendable out of said plane by a distance greater than a maximum lateral dimension of said structure, such that said structure topside continues to face in a general topside direction.

2. The flexible circuit according to claim 1, wherein said structure is a spiral.

3. The flexible circuit according to claim 2, wherein said spiral is an Archimedes spiral.

4. The flexible circuit according to claim 2, wherein said spiral is a parabolic spiral.

5. The flexible circuit according to claim 2, wherein said spiral is a polygonal spiral.

6. The flexible circuit according to claim 5, wherein said spiral is one of a square spiral, a triangular spiral, a pentagonal spiral and a hexagonal spiral.

7. The flexible circuit according to claim 1, wherein said structure has geometric features selected from a group comprising spiral, bend, curve, twist, turn, curl, loop, u-turn end zig-zag.

8. The flexible circuit according to claim 1, wherein said structure is defined by dashed perforations.

9. The flexible circuit according to claim 1, wherein said structure comprises a boss for receiving a force to extend said structure out of said plane.

10. The flexible circuit according to claim 1 further comprising at least a first insulated pathway and a second insulated pathway.

11. A flexible circuit comprising:
    a flexible substrate having a plane;
    a flexible and extensible structure formed within and as part of said substrate, said flexible and extensible structure includes a topside and is extendable out of said plane by a distance greater than a maximum lateral dimension of said structure such that said topside remains facing in a general topside direction; and
    an insulated capillary for transferring a fluid on said structure.

12. The flexible circuit according to claim 11, wherein said structure is a spiral.

13. The flexible circuit according to claim 12, wherein said spiral is an Archimedes spiral.

14. The flexible circuit according to claim 12, wherein said spiral is a a parabolic spiral.

15. The flexible circuit according to claim 12, wherein said spiral is a polygonal spiral.

16. The flexible circuit according to claim 12, wherein said spiral is one of a square spiral, a triangular spiral, a pentagonal spiral and a hexagonal spiral.

17. The flexible circuit according to claim 11, wherein said structure has geometric features selected from a group comprising spiral, bend, curve, twist, turn, curl, loop, u-turn and zig-zag.

18. The flexible circuit according to claim 11, wherein said structure is defined by dashed perforations.

19. The flexible circuit according to claim 11, wherein said structure comprises a boss for receiving a force to extend said structure out of said plane.

20. The flexible circuit according to claim 11 further comprising a second insulated pathway on said structure.

21. A flexible circuit comprising:
   a flexible planar substrate;
   a flexible and extensible structure formed within and as part of said substrate, said structure having a top side;
   a capillary for transferring fluid on said structure: and
   wherein said structure is extendable substantially perpendicular to said plane within the region defined by said plane, such that said top side remains facing in a general topside direction.

22. The flexible circuit according to claim 21 further comprising an insulated pathway formed on said structure.

23. The flexible circuit according to claim 21, wherein said structure is a spiral.

* * * * *

UNITED STATES PATENT AND TRADEMARK OFFICE
CERTIFICATE OF CORRECTION

PATENT NO.        : 7,275,562 B2                                    Page 1 of 1
APPLICATION NO.   : 09/981840
DATED             : October 2, 2007
INVENTOR(S)       : Barth et al.

It is certified that error appears in the above-identified patent and that said Letters Patent is hereby corrected as shown below:

In column 8, line 12, in Claim 1, delete "stucture" and insert -- structure --, therefor.

In column 8, line 34, in Claim 7, delete "end" and insert -- and --, therefor.

In column 8, line 58, in Claim 14, before "parabolic" delete "a".

In column 8, line 61, in Claim 16, after "claim" delete "12," and insert -- 15, --, therefor.

Signed and Sealed this

Thirteenth Day of May, 2008

JON W. DUDAS
*Director of the United States Patent and Trademark Office*